US007405089B2

(12) United States Patent
Bloess et al.

(10) Patent No.: US 7,405,089 B2

(45) Date of Patent: Jul. 29, 2008

(54) METHOD AND APPARATUS FOR MEASURING A SURFACE PROFILE OF A SAMPLE

(75) Inventors: Harald Bloess, Dresden (DE); Uwe Wellhausen, Dresden (DE); Peter Reinig, Dresden (DE); Peter Weidner, Rötz (DE); Pierre-Yves Guittet, Dresden (DE); Ulrich Mantz, Dresden (DE)

(73) Assignee: Infineon Technologies AG, Munich (DE)

( * ) Notice: Subject to any disclaimer, the term of this patent is extended or adjusted under 35 U.S.C. 154(b) by 385 days.

(21) Appl. No.: 11/096,174

(22) Filed: Mar. 31, 2005

(65) Prior Publication Data

US 2005/0258365 A1 Nov. 24, 2005

(30) Foreign Application Priority Data

Mar. 31, 2004 (DE) ...................... 10 2004 015 924
Jun. 15, 2004 (DE) ...................... 10 2004 028 851

(51) Int. Cl.
*H01L 21/66* (2006.01)
*G01R 31/26* (2006.01)

(52) U.S. Cl. ........... 438/14; 257/E21.529; 257/E21.521

(58) Field of Classification Search ................... 438/14, 438/FOR. 101, FOR. 142; 257/E21.529, 257/E21.521

See application file for complete search history.

(56) References Cited

U.S. PATENT DOCUMENTS

| | | | | |
|---|---|---|---|---|
| 5,772,905 | A | 6/1998 | Chou | |
| 6,334,960 | B1 | 1/2002 | Willson et al. | |
| 6,696,220 | B2 | 2/2004 | Bailey et al. | |
| 6,954,275 | B2 * | 10/2005 | Choi et al. | 356/614 |
| 7,060,402 | B2 * | 6/2006 | Choi et al. | 430/22 |
| 2004/0189994 | A1 * | 9/2004 | Sreenivasan et al. | 356/399 |
| 2004/0251775 | A1 * | 12/2004 | Choi et al. | 310/311 |
| 2005/0089774 | A1 * | 4/2005 | Choi et al. | 430/22 |

OTHER PUBLICATIONS

Chou, Stephen Y. et al., "Nanoimprint Lithography," American Vacuum Society, J. Vac. Sci. Technol. B 14(6), pp. 4129-4133, (Nov./Dec. 1996).

Colburn, M. et al., "Development and Advantages of Step-and-Flash Lithography," Solid State Technology, pp. 11, (Jul. 2001).

Heidari, Babak et al., "Large Scale Nanolithography using Nanoimprint Lithography," American Vacuum Society, J. Vac. Sci. Technol. B 17(6), pp. 2961-2964, (Nov./Dec. 1999).

(Continued)

*Primary Examiner*—Michelle Estrada
(74) *Attorney, Agent, or Firm*—Dicke, Billig & Czaja, PLLC

(57) ABSTRACT

In order to measure a surface profile of a sample, an imprint of the surface profile to be examined is produced in a transfer material. The sample contains processed semiconductor material and is in particular a patterned semiconductor wafer or part of a patterned semiconductor wafer. The transfer material is deformable and curable under suitable ambient conditions. The transfer material may be a thermoplastic material or a material which is deformable as desired after application on a substrate and cures in one case by means of irradiation with photons having a suitable wavelength or alternatively heating. The transfer material may be configured in such a way that the imprint produced is the same size as or alternatively of smaller size than the surface profile. The imprint produced is subsequently measured by known methods.

21 Claims, 11 Drawing Sheets

OTHER PUBLICATIONS

Schaper, Charles D., “MxL: Pseudo-Maskless, High-Throughput Nanolithography,” Proc. SPIE Emerging Lithographic Technologies, vol. 5037, pp. 12, (2003).

Wu, Wei et al., “Large Area High Density Quantized Magnetic Disks Fabricated using Nanoimprint Lithography,” American Vacuum Society, J. Vac. Sci. Technol. B 16(6), pp. 3825-3829, (Nov./Dec. 1998).

* cited by examiner

METHOD AND APPARATUS FOR MEASURING A SURFACE PROFILE OF A SAMPLE

CROSS-REFERENCE TO RELATED APPLICATIONS

This Utility Patent Application claims priority to German Patent Application No. DE 10 2004 028 851.8, filed on Jun. 15, 2004, and German Patent Application No. DE 10 2004 015 924.6, filed on Mar. 31, 2004, which are both incorporated herein by reference.

BACKGROUND

One embodiment of the present invention relates to a method and also an apparatus for measuring a surface profile of a sample which contains processed semiconductor material, that is, a semiconductor wafer or a part of a semiconductor wafer.

In the production of semiconductor components such as, for example, DRAM memory modules ("Dynamic Random Access Memory"), logic circuits, optoelectronic components or MEMS ("Micro-Electro-Mechanical Systems"), the associated integrated circuits are firstly processed at the wafer level. After the fabrication steps have ended, the wafer is singulated into chips each containing the corresponding circuits and they are packaged in suitable housings in order to produce the semiconductor components.

In order to produce DRAM memory modules, the wafer undergoes for example a multiplicity of patterning steps in the course of which, inter alia, layers are deposited and, in particular, depressions are etched into the substrate surface.

FIG. 7A illustrates an exemplary cross-sectional view through a trench capacitor associated with a DRAM memory cell after the so-called recess 2 etching step has been carried out.

In FIG. 7A, an $Si_3N_4$ layer 10 is deposited on the surface of a silicon wafer 1. Capacitor trenches 11 are etched into the resulting surface 3, at the edge of which capacitor trenches, in each case after the formation of a bottom capacitor electrode (not shown) a capacitor dielectric (not shown) and a top capacitor electrode 15, an $SiO_2$ spacer 12 is respectively formed, which acts as an insulation collar in the finished storage capacitor. The resulting trench is filled with a polysilicon filling 13 and etched back in the recess 2 etching step for preparing the contact regions for connecting the storage capacitor to the selection transistor, thus resulting in the depression 14 having the depth $R_2$ with the trench width d as illustrated in FIG. 7A.

Metrology methods are of particular significance for further development of existing processes and products. They are used, for example after carrying out the recess 2 etching step, to check whether the etched depression has the predefined depth and width and whether the bottom has been etched flat or has bulges. Furthermore, contaminants that occur, for example regions removed incompletely during etching, can be demonstrated by means of metrology methods. The insights obtained by means of the metrology methods serve on the one hand for monitoring the individual process steps in order to ensure that the processed structures satisfy the necessary requirements, and on the other hand for process optimization. For example, on the basis of the insights obtained, the etching parameters are altered for wafers that are subsequently to be processed.

Metrology methods that are customary at the present time include in particular atomic force microscopy and other scanning probe methods and physical defect analysis, including scanning electron microscopy or FIB methods ("Focused Ion Beam"). Although the methods of physical defect analysis do indeed yield an actual image or profile of the structures produced, they have the disadvantages. For example, the wafer has to be destroyed for carrying out examination methods of this type, as a result of which practical applicability is restricted.

Examples of further customary measurement methods are IRSE (Spectroscopic Ellipsometry using InfraRed beams) and scattering methods (Spectroscopic Scatterometry or Specular Spectroscopic Scatterometry). Although the IRSE methods enable the depth to be determined in vertical structures, the measurement of profiles is not possible. Scattering methods enable profiles to be reliably reconstructed as long as the structures retain their periodic arrangement and they have a simple construction.

When using the measurement methods mentioned, moreover, the problem also occurs that the patterned zones contain different types of materials with different properties. Thus, when examining the trenches illustrated in FIG. 7A, the respective properties of the insulator layers 10, 12 and of the polysilicon fillings 13, 15 influence the measurement result and also have to be taken into account in the modeling—when using scattering methods for example.

In order to increase the storage capacity of DRAM memory cells, it is necessary to introduce ever smaller feature sizes and for example to etch depressions ever deeper. This means that in FIG. 7A by way of example, the trench width d becomes smaller and smaller, and the depth $R_2$ and the aspect ratio, that is to say the ratio of trench depth to trench width, greatly increases.

The construction of capacitor trenches, by way of example, also increases in complexity since structures are formed on one side within the trenches.

This is illustrated by way of example in FIG. 7B. In FIG. 7B, a structure 16 made of $SiO_2$, for example, is formed on one side within a capacitor trench 11 partly filled with a polysilicon material 13. The width d of the capacitor trench 11 is 90 nm for example, and the width of the structure 16 is 50 nm, so that the lower trench region has a width b of 40 nm. The depth R of the trench 11 is 380 nm, for example.

If the metrology methods that are customary at the present time are applied to the structures of this type, then various problems occur. For example, it becomes difficult, on account of the evaluation algorithms of the atomic force microscope, to measure trenches having a width d of less than 70 nm. Furthermore, the tip form of the probe and also the scanning mechanism used corrupt the measurement result. Moreover, it is impossible for such a narrow gap as that illustrated in FIG. 7B to be scanned using atomic force microscope probes that are customary at the present time.

A particular problem arises if, for example, a structure as illustrated in FIG. 7C is to be measured. In FIG. 7C, a one-sided structure 16, for example made Of $SiO_2$, is formed in an upper part of a trench 11 formed in a semiconductor substrate 1 in such a way that the resulting trench diameter in a lower trench part is larger than in an upper trench part. As a consequence it is impossible to measure the lower trench part of this structure using an atomic force microscope, for example, since the part lying below the structure 16 is not accessible to the probe of the atomic force microscope.

U.S. Pat. No. 5,772,905 describes a lithographic method for transferring a structure, in the case of which a shaped piece with nanostructures in its surface region is impressed into a resist layer on a substrate. The pattern defined on the shaped piece is transferred into the resist layer by exerting pressure and heating the resist layer to a temperature above the glass transition temperature for a predetermined time duration and then allowing it to cool down. The structure of the shaped piece is transferred into the substrate surface by means of a suitable aftertreatment using, by way of example, reactive ion etching and, if appropriate, a subsequent deposition method followed by lift-off.

U.S. Pat. No. 6,334,960 B1 describes a further lithographic method for transferring a structure from a shaped piece to a semiconductor wafer, in the case of which the semiconductor wafer is covered with a polymer transfer layer and a polymerizable liquid. The shaped piece is brought into contact with the polymerizable liquid, and the polymerizable liquid is cured by radiating in UV light.

SUMMARY

In one embodiment of the present invention, a method enables reliable measurement of a surface profile containing structures having ever larger aspect ratios and ever smaller horizontal dimensions. In order to measure a surface profile of a sample, an imprint of the surface profile to be examined is produced in a transfer material. The sample contains processed semiconductor material and is in particular a patterned semiconductor wafer or part of a patterned semiconductor wafer. The transfer material is deformable and curable under suitable ambient conditions. The transfer material may be a thermoplastic material or a material which is deformable as desired after application on a substrate and cures in one case by means of irradiation with photons having a suitable wavelength or alternatively heating. The transfer material may be configured in such a way that the imprint produced is the same size as or alternatively of smaller size than the surface profile. The imprint produced is subsequently measured by known methods. One embodiment of the invention also provides an apparatus for measuring a surface profile of a sample.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1A:
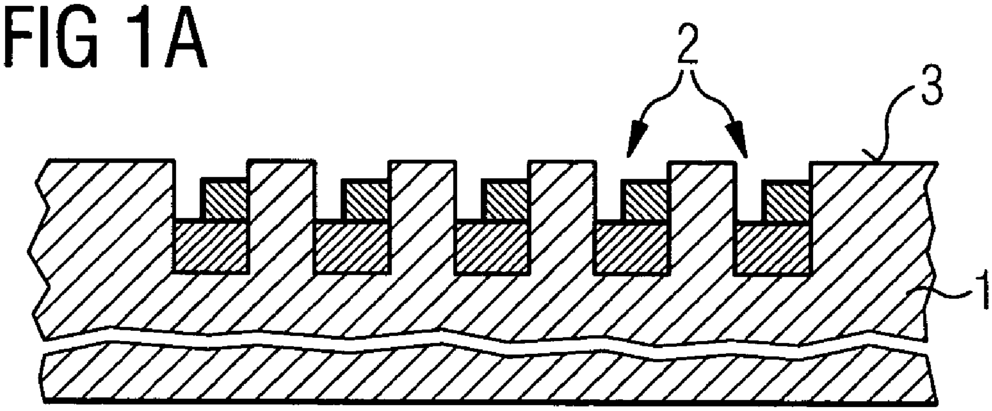
FIGS. 1A to 1D are schematic illustrations of a method according to one embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

According to one embodiment of the present invention, a method for measuring a profile of a sample surface is disclosed. The sample contains processed semiconductor material. The method includes bringing at least one part of the sample surface into contact with a transfer material, which is deformable and curable under suitable ambient conditions, this step being performed under the suitable ambient conditions in such a way that an imprint of at least one part of the surface profile is transferred into the transfer material. The method also includes separating the sample surface from the transfer material, this step being suitable for uncovering the imprint of at least one part of the surface profile. The method includes measuring the uncovered imprint, a measurement result being obtained, and evaluating the measurement result, an item of information about the surface profile being obtained.

One embodiment of the present invention provides a method in which firstly an imprint of a surface profile to be examined is produced in a transfer layer and then the imprint is measured. In this case, the sample contains processed semiconductor material and is in particular a patterned semiconductor wafer or part of a patterned semiconductor wafer. The transfer material is deformable and curable under suitable ambient conditions. To put it more precisely, it may comprise for example a thermoplastic, that is to say thermally deformable, material which is hard during the process of bringing it into contact with the sample surface but becomes soft and deformable upon heating and cures again after cooling. However, it may also comprise a material which is liquid during the process of bringing it into contact with the sample surface and is deformable as desired after application and cures for example by means of irradiation with photons having a suitable wavelength or alternatively heating.

As a result, structures that have not been accessible to the conventional measurement methods can be measured reliably and nondestructively.

By producing an imprint, depressions in the sample surface become projecting regions in the transfer material. One embodiment of the present invention makes it possible to measure even depressions having a high aspect ratio, provided that the distance between said depressions is large enough. Moreover, the structures to be measured, after the production of the imprint, are formed only in a single material, thereby avoiding influences of adjacent layers and materials on the measurement method.

The mirror image of the profile to be measured is measured by means of the imprint. Thus, by way of example, the bottom region of a structure, which is accessible with difficulty using an atomic force microscope, becomes a ridge region, which is more easily accessible. Consequently, it is possible, for example, to analyze all regions of the structure through simultaneous measurement of sample and imprint.

Since the imprint is not required for the further processing of the wafer, the imprint can also readily be destroyed in the course of its measurement. The imprint and original sample can be measured simultaneously, for example in order to detect different parameters or layer thicknesses. The measurement time can thereby be shortened.

The transfer material may be applied directly on the sample and be stripped away after the imprint has been produced. As an alternative, however, the method may also additionally comprise the steps for providing a substrate and applying the layer made of the transfer material on the substrate, these steps being carried out before the step for bringing the sample surface into contact with the transfer material, and, in the course of the step for bringing the sample surface into contact with the transfer material, the transfer material applied on the substrate being brought into contact with the sample surface.

In particular, the production of the imprint of the profile to be measured in the transfer layer may be effected according to known nanoimprint methods. In this case, the wafer to be examined is used as a shaped piece and brought into contact with a layer made of a suitable transfer material applied on a substrate. The transfer material may comprise for example a thermoplastic polymer, a thermally curable polymer or a polymer which is curable by radiating in photons.

If the transfer material comprises a thermoplastic polymer, the method according to one embodiment of the invention may comprise the steps for heating the transfer material to a temperature at which the transfer material becomes soft, prior to bringing the sample surface into contact with the transfer material, and cooling the transfer material to a temperature at which the transfer material becomes hard, after bringing the sample surface into contact with the transfer material. In this case, the temperature at which the transfer material becomes soft is in particular a temperature that is higher than the glass transition temperature of the transfer material.

In the selection of the heating temperature, care should be taken to ensure that the function of the processed semiconductor components is not impaired and the thermal budget of the wafer is not burdened to an excessively great extent.

Examples of suitable thermoplastic polymers include polymethyl methacrylate (PMMA), polycarbonate, polyester and also polymers based on novolak resins and further thermoplastic polymers familiar to the person skilled in the art.

If the transfer material contains a polymer that is curable under the action of photons, then the transfer material is in one case irradiated with photons, for example UV light, during the process of bringing the sample surface into contact with the transfer material, so that the transfer material cures. In one case, when using a substrate, the latter is in this case transmissive to the photon radiation, that is to say is produced from quartz, for example, in the case of UV radiation so that the irradiation can be effected from the rear side of the substrate.

If the transfer material is curable by means of photons, then heating is not necessary for transferring the surface profile. Accordingly, no thermal loading of the processed wafer takes place either, and its thermal budget is conserved.

Examples of materials that are curable under the action of photons include prepolymers that are curable under the action of photons, for example acrylate- or epoxide-based materials or organosilicon compounds, in each case with a suitable addition which initiates the photopolymerization process as a photoinitiator. In particular, it is possible to use acrylate-based monomer mixtures, and silicon-containing acrylates or diacrylates such as, for example, (3-acryloxypropyltristrimethylsiloxy)silane. Materials of this type are produced commercially for nanoimprint methods by, for example, Brewer Science Inc. (Brewer Science DUV30J ARC) or Nanoex Inc. Materials of this type are cured in particular by UV light, for example having a wavelength of 330 to 400 nm.

The transfer material may also be curable thermally, that is to say by heating. For example, a thermally curable material used may be a prepolymer whose polymerization process is initiated by heat. In this case, after the process of bringing the sample surface and the transfer material into contact, the sample is heated to a temperature at which curing takes place. In this case, too, in the selection of a suitable material and the heating temperature, care must be taken to ensure that the thermal budget of the wafer is not burdened to an excessively great extent.

When using materials that are initially liquid, that is, deformable, and cure, for example, by means of radiating in photons or heat, care must be taken to ensure a suitable viscosity of the materials. The viscosity of the materials should not be too high such that they are deformable after application to the substrate or the sample surface even if for example, the pressure between sample and substrate is not very high. On the other hand, the viscosity should not be too low either, in order to ensure unproblematic handling. At the present time, in particular monomers having a low molecular weight and a length of less than 1 nm are regarded as suitable since monomers of this type have a suitable viscosity.

All materials that can be used for the transfer material may contain further additions which ensure a reduced adhesiveness to the sample and, when using a substrate, an increased adhesiveness to the substrate.

Depending on the measurement method that is to be used later, the transfer material may also contain dopants which, for example, increase the accuracy or sensitivity of the measurement method.

In one case, when using a substrate, during the step of bringing the sample and the substrate into contact, a pressure is also exerted on the sample and the substrate, so that the surface profile is transferred better. If a thermoplastic polymer is used as the transfer material, a pressure of 4 to 14 MPa, for example, is regarded as suitable. When using a transfer material that is initially liquid and is cured only by heating or radiating in photons, lower pressures are sufficient.

The layer thickness of the transfer material that is to be applied depends on the maximum height difference $\Delta z$ between the height of the highest projecting region and the height of the deepest depression within the surface profile. In this case, the expressions “height” and “depth” relate in each case to the direction perpendicular to the wafer surface. According to one embodiment of the present invention, the layer thickness of the transfer material is least 1.5 times the maximum height difference $\Delta z$, in particular twice the maximum height difference $\Delta z$.

In the selection of the layer thickness, care should be taken to ensure that the surface profile is transferred completely with its entire vertical extent into the transfer layer. In most of the subsequent measurement methods a further advantage arises if the transfer material layer remaining below the transferred surface profile has a certain thickness, with the result that the influences of the underlying substrate on the measurement method can be disregarded or are at least not very strong.

In the case of the known nanoimprint methods, in contrast, it has been regarded as important for the layer thickness of the transfer material that remains below the transferred structure not to be too large since the remaining layer has to be removed for further processing of the wafer.

The transfer material is applied on the substrate or on the sample according to generally known application methods such as, for example, spin-on, vapor deposition, spraying on, squeegee coating, etc. The suitable application method depends in turn on the viscosity of the transfer material. A transfer material having a low viscosity may be applied suitably in particular by means of an apparatus that permits the liquid transfer material to be dripped onto the substrate.

One embodiment of the present invention is suitable for measuring the surface profile of a patterned semiconductor wafer, in particular a patterned silicon wafer. The wafer comprises a multiplicity of vertical structures, for example, depressions and projecting regions. The horizontal dimensions are less than 1 μm in this case and a typical aspect ratio, that is, ratio of vertical to horizontal dimension, is in one case less than 2.5.

The surface profile of the sample that is to be examined may be transferred to a substrate which is the same size as the sample or alternatively is of a size that deviates therefrom. The sample may be, for example, a semiconductor wafer, and the substrate likewise is the size of a wafer. For example, the substrate may be a silicon wafer. However, the substrate may also be of a size which is smaller than that of a wafer, for example, be as large as a chip or a chip region or as large as a plurality, for example 4, or an arbitrary number of chips. In one case, the size of the substrate may correspond to the image field size in a preceding exposure operation.

The use of a smaller substrate size affords the effect that the transfer method for producing an imprint can be carried out more simply. For example, fewer problems occur in the course of bringing the sample surface uniformly into contact with the transfer material, so that the distance between transfer material and sample surface can be kept identical at all points of the substrate.

If the transfer material is brought into contact with the sample surface without using a substrate, then the imprint produced after the curing operation may be stripped away in a succeeding step.

In this case, the transfer material may be applied and stripped away over the whole area. However, it is also possible for the transfer material to be applied only locally and subsequently to be stripped away only locally. In this case, a customary size of the imprint typically again corresponds to the size of one or more chips and may correspond in particular to the image field size in a preceding exposure step.

The transfer material may be applied locally by being locally dripped on or laid on without spinning. It may be locally stripped away by being adhesively bonded or pressed onto a pin-type stripping apparatus. Local application and stripping away can be carried out more simply than whole-area application and stripping away, and no problems arise with residues adhering to the sample surface.

According to one embodiment of the present invention, the production of the imprint, and in one case the orientation of sample and substrate, may be effected, for example, in commercially available nanoimprint devices.

According to one embodiment of the present invention, the transfer material may be a material which produces an imprint with the same vertical and horizontal dimensions as in the case of the surface profile to be measured. However, it may also be a material which shrinks in the course of the curing operation, so that the resulting imprint has smaller horizontal and/or vertical dimensions than the surface profile to be measured. A material of this type may be curable by arbitrary curing mechanisms. In one case, it may be a material whose curing gives rise to a change in configuration state from amorphous to crystalline.

Examples of materials which shrink upon curing include in particular spin-on glass, which cures and shrinks by means of heating to temperatures higher than 200 C., and also spin-on dielectrics.

Such shrinking properties are usually likely to be disadvantageous in semiconductor technology. In the case of the method according to one embodiment of the invention, however, their use affords manifold advantages. Thus, when using shrinking materials, it is possible to measure even structures of a surface profile in which the diameter in a lower region is greater than in an upper region, "lower" and "upper" being relative to the sample surface in each case, and which are not accessible to other measurement methods. Furthermore, fewer defects, in particular residues of the transfer material, occur when stripping away the imprint from the sample surface.

After the imprint has been produced, it can be measured, according to one embodiment of the present invention, by means of known methods such as, for example, scanning probe methods, in particular atomic force microscopy, by means of scattering or ellipsometric methods, scanning electron microscopy or microscopy using focused ion beams (FIB).

After the imprint has been measured, the transfer material can be removed from the substrate so that the substrate can be used for a further method. As a result, the method can be realized nondestructively and thus cost-effectively.

One embodiment of the present invention furthermore provides an apparatus for measuring a surface profile of a sample, the sample containing processed semiconductor material. The apparatus includes a transfer device, which is suitable for bringing at least one part of the sample surface into contact with a transfer material, so that an imprint of at least one part of the surface profile is transferred into the transfer material. The apparatus further includes a device for measuring the imprint, a measurement result being obtained, and an analysis device which is suitable for evaluating the measurement result and for obtaining therefrom an item of information about the surface profile.

Consequently, as has been explained above, the apparatus according to one embodiment of the invention enables reliable and nondestructive measurement of surface structures whilst utilizing conventional measuring arrangements.

In one case, an apparatus according to one embodiment of the invention may comprise a stripping apparatus, which is suitable for separating the transfer material with the imprint of at least one part of the surface profile from the sample and supplying the imprint to the measuring device.

In FIG. 1A, a silicon wafer 1 to be examined has a multiplicity of vertical structures 2 in the region of its first main surface 3. In this case, the vertical structures 2 may have an arbitrary form, and may have for example the form illustrated in FIG. 7B.

In order to measure the surface profile of the silicon wafer 1, the structures 2 present in the first main surface 3 are transferred into a suitable transfer or resist material 4. For this purpose, firstly a suitable substrate 5, for example a dummy silicon wafer, is coated with a layer made of a suitable transfer material.

In accordance with one embodiment of the present invention, a thermoplastic material, to put it more precisely a thermoplastic polymer which is deformable under the action of heat and solidifies again after cooling, for example PMMA (polymethyl methacrylate), is used as the transfer material.

A PMMA layer 4 is applied with a suitable layer thickness on the substrate 5 by means of spinning-on, by way of example. A suitable layer thickness is dimensioned in such a way that the profile to be measured can be transferred into the transfer layer. In one case, the layer thickness is greater than the difference Δz between the highest projecting region and the deepest depression of the vertical structure.

Figure 8:
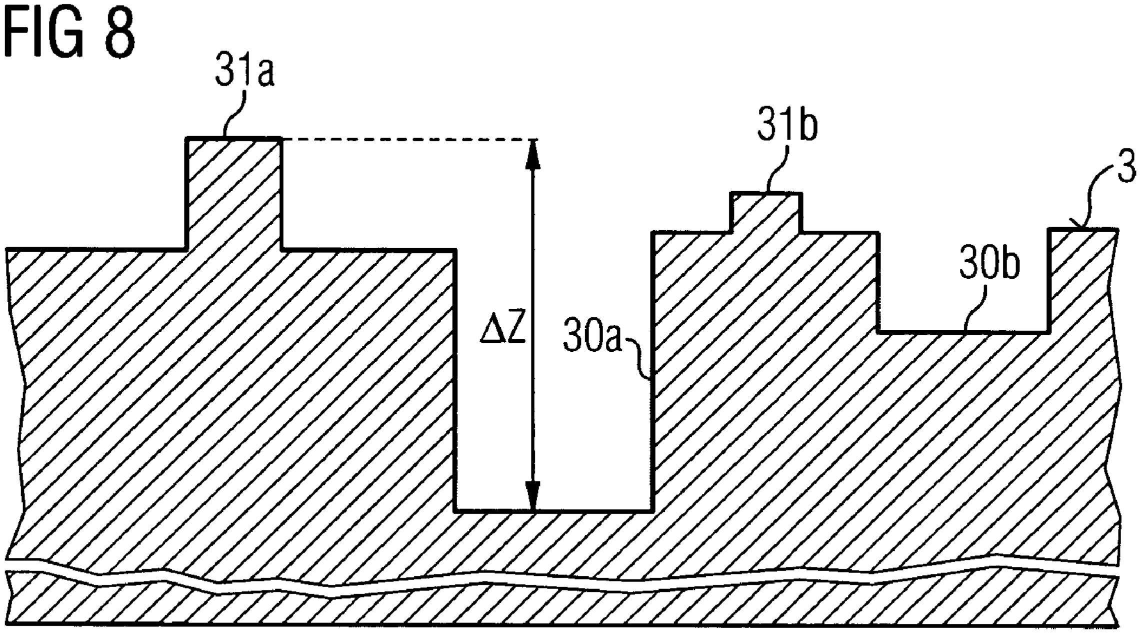
FIG. 8 illustrates an exemplary surface profile for illustrating the magnitude $\Delta z$.

FIG. 8 illustrates the magnitude Δz for an exemplary embodiment of the present invention. FIG. 8 illustrates a plurality of projecting regions 31*a*, 31*b* and a plurality of depressions 30*a* and 30*b*. As can be seen from FIG. 8, the maximum height difference within the surface profile Δz corresponds to the distance between a highest projecting region 31*a* and a deepest depression 30*a*, said distance being determined perpendicularly to the sample surface, the terms “highest” and “deepest” relating to a direction perpendicular to the sample surface. If there are no depressions, but rather only projecting regions, then the magnitude Δz corresponds to the distance between the highest projecting region and the sample surface 3, said distance being measured perpendicularly to the sample surface. If there are no projecting regions, but rather only depressions, then the magnitude Δz corresponds to the distance between the deepest depression and the sample surface 3, said distance being measured perpendicularly to the sample surface.

Figure 4A:
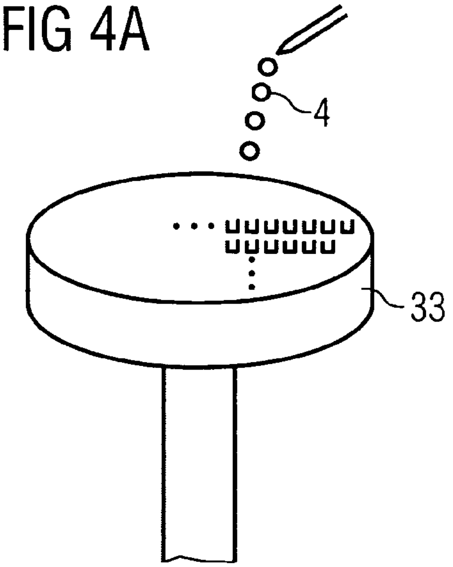
FIGS. 4A to 4C illustrate steps for producing an imprint in an alternative embodiment of the present invention.
Figure 4B:
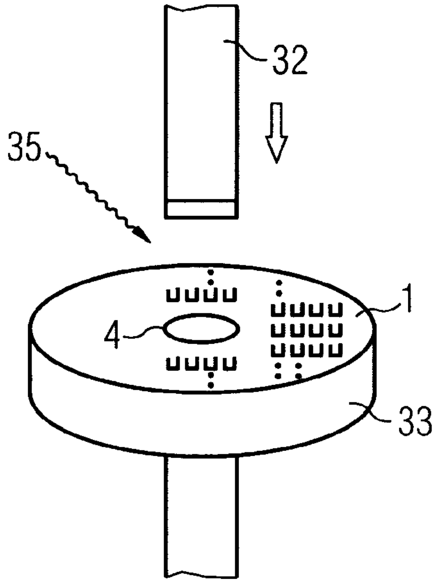

According to one embodiment of the invention, the layer thickness is 1.5 to 6 times, for example 4 times, the magnitude R in FIG. 4B. In FIG. 7B, said difference Δz is 380 nm. A layer thickness of 1520 nm correspondingly results.

If appropriate, before the surface profile of the sample is transferred into the transfer material, a monomolecular layer of a separating agent (not shown) may be applied on the sample surfaces. Said layer is configured in such a way that it does not impair the transfer accuracy of the structures to be measured into the transfer material, but facilitates the release of sample and transfer material after the transfer material has cured. Examples of such separating agents are generally known and described in the literature.

Figure 1B:
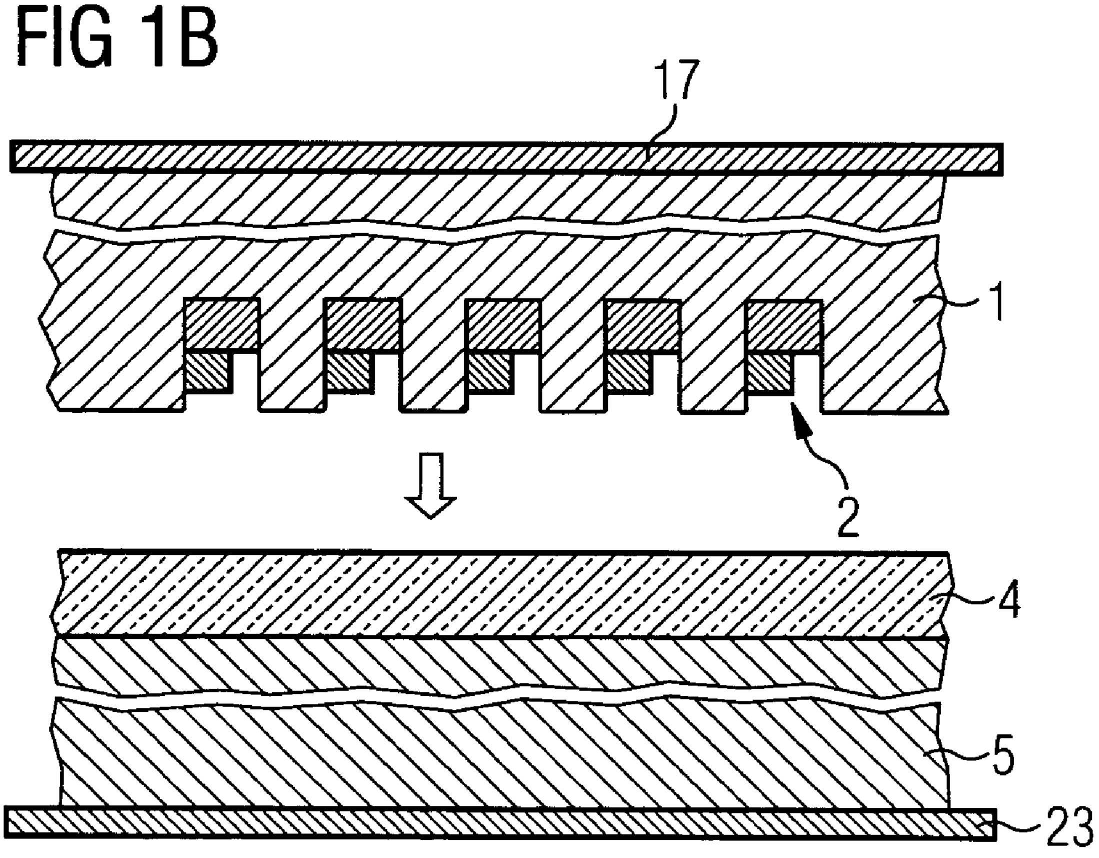

As illustrated in FIG. 1B, the surface profile of the sample 1, that is, the vertical structures 2 contained in the sample surface 3, is transferred into the transfer material 4. For this purpose, firstly the sample 1 and the substrate 5 coated with the transfer material are respectively placed onto a heatable sample holder 17 and onto a heatable substrate holder 23 and heated to a heating temperature above the glass transition temperature of the transfer material. The glass transition temperature of PMMA is 105° C., for example; accordingly, a heating temperature of 140 to 200° C., for example, is to be regarded as suitable.

Once the heating temperature has been reached, sample 1 and substrate 5 are oriented, for example using orientation or alignment methods known from photolithography. The heating process of the sample holder and substrate holder is then ended, and the sample 1 is pressed against the transfer material and held until the temperature has fallen below the glass transition temperature of the transfer material 4. A suitable contact pressure between sample and transfer material is 4 to 14 MPa, for example, and a suitable press-on time is approximately 10 minutes.

After the substrate 5 has been cooled to a temperature below the glass transition temperature of the transfer material 4, the sample surface 3 is separated or stripped away from the transfer material by means of known methods.

Figure 1C:
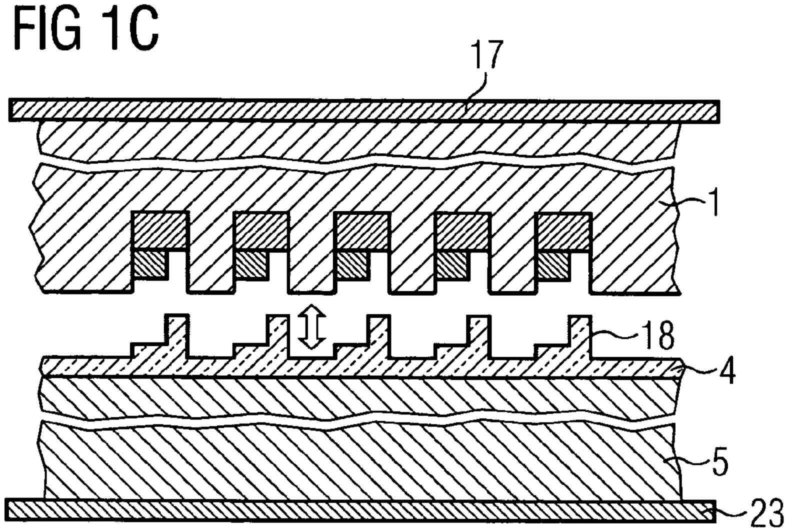

As is illustrated in FIG. 1C, as a result the transfer layer 4 contains an imprint 18 of the structures to be measured or of the surface profile to be measured. The imprint 18 illustrated in FIG. 1C is formed in only one material, the transfer material. Instead of the depressions having the width b illustrated in FIG. 4B, which depressions cannot be measured by conventional methods, it now has projecting regions. It has been shown that the transfer ratio of the profile into the transfer material is 1:1, that is, that the depth R of the depression 11 corresponds exactly to the height of the imprint. If appropriate, said transfer ratio may also be checked for example by means of the measurement methods of physical defect analysis.

According to one embodiment of the present invention, however, it is also possible to use a transfer material 4 which enables a transfer with a transfer ratio that is not 1:1. As a result, it is possible to produce an imprint which is smaller than the surface profile to be measured.

Figure 1D:
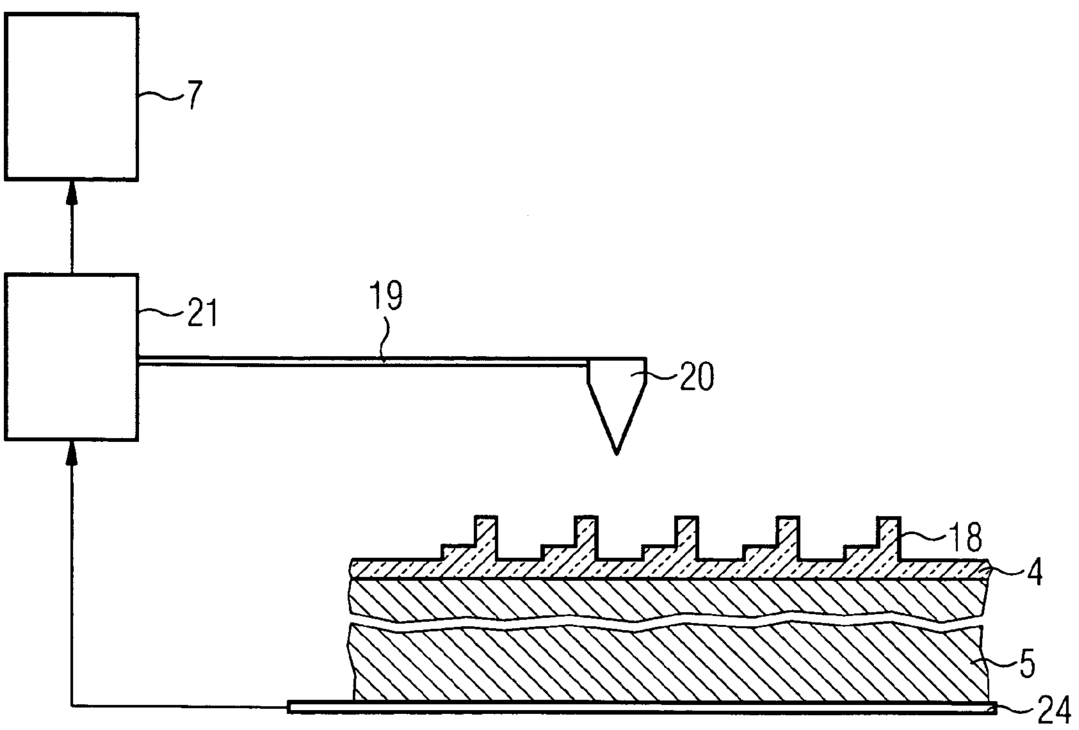

As is illustrated in FIG. 1D, in a next step, the imprint 18 is measured using known methods.

For example, the measurement may be effected using an atomic force microscope (AFM) 6. A generally known atomic force microscope comprises a carrier element 19, a probe 20 being fitted to the free end thereof. The base of the probe 20 is fitted to the carrier element 19, while the probe end region opposite to the base interacts with the transfer material surface 18 to be examined. In this case, the probe end region may taper in a pointed fashion, in particular. Examples of probes that are typically used include specially processed glass fibers, in particular made of silicon dioxide, which taper in a pointed fashion and may be coated with metal, carbon tips, silicon tips and cylindrical carbon nanotubes.

The carrier element 19 is usually designed as a spring beam. In the simplest case, the force acting between the probe end region and the surface 18 to be measured brings about a deflection of the spring beam 19, which is detected by a sensor device (not illustrated). Customary detection mechanisms in this case are capacitance measurements or optical detection methods using a laser beam. The substrate 5 to be measured is arranged on a measurement table 24 that can be moved in the x,y direction, that is to say parallel to the substrate surface. The atomic force microscope furthermore contains a control and processing device 21, which controls the relative movement between the measurement tip 20 and the substrate 5 to be measured and furthermore evaluates the detected data in order to determine therefrom the measured surface profile in the transfer material 4. It is customary, during the measurement operation, for the substrate 5 to be scanned in the x,y direction and for the deflection of the spring beam 19 to be simultaneously measured, so that the surface profile of the imprint 18 in the transfer layer is obtained as the measurement result.

In a next step, the surface profile of the sample 1 is obtained from the measurement result. For this purpose, the data output by the control and processing device are fed to an analysis device 7, which determines the measurement data for the original from the data obtained for the imprint. In this case, the analysis device calculates in particular measured depths in heights of the sample profile to be examined and measured heights in depths of the sample profile to be examined. Measured ridge widths between depressions become widths of depressions of the sample profile and measured widths of depressions become ridge widths between depressions of the sample profile.

According to one embodiment of the present invention, the sample itself may also be measured in parallel. By way of example, an $Si_3N_4$ layer such as the $Si_3N_4$ layer 10 illustrated in FIG. 7A may additionally be arranged on the sample surface. The thickness of said layer may be determined by means of an ellipsometric method, for example. Finally, it is possible to form the difference from this measured layer thickness and the etched depth R obtained from the imprint. The measurement time can be shortened by virtue of parallel measurement being effected on the imprint and the sample.

Furthermore, by way of example, the sample surface and its mirror image can be measured in parallel with one another using the atomic force microscope. Additional information about the quality of the structures produced can thereby be obtained.

According to an alternative embodiment of the present invention, the imprint produced in the transfer material can be measured by an arbitrary method such as is employed in metrology, for example.

If appropriate, it is also possible, at the beginning of a measurement series, to subject a sample and, if appropriate, also a substrate with an imprint to a method of physical defect analysis in order to check the extent to which the transferred surface profile 18 corresponds to the profile 2 to be measured in the sample surface 3.

Consequently, one embodiment of the present invention enables a surface profile to be measured indirectly by firstly producing an imprint of the surface profile, then measuring the imprint and reconstructing the surface profile from this measurement result.

According to one embodiment of the present invention, the profile 2 of the sample surface 3 to be measured may also be transferred by arbitrary other methods, in particular by a method in which the transfer material is initially liquid or deformable and is cured by the action of radiation having a suitable wavelength.

FIGS. 2A to 2D illustrate another embodiment of the present invention, in which an imprint of a surface profile of a wafer to be measured is produced on a substrate 5 which is significantly smaller than the wafer 1, with a transfer layer that is curable by UV radiation.

Figure 2A:
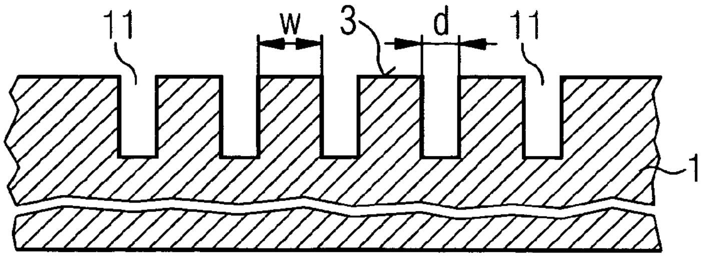
FIGS. 2A to 2E are schematic illustrations of a method according to one embodiment of the invention.
Figure 7A:
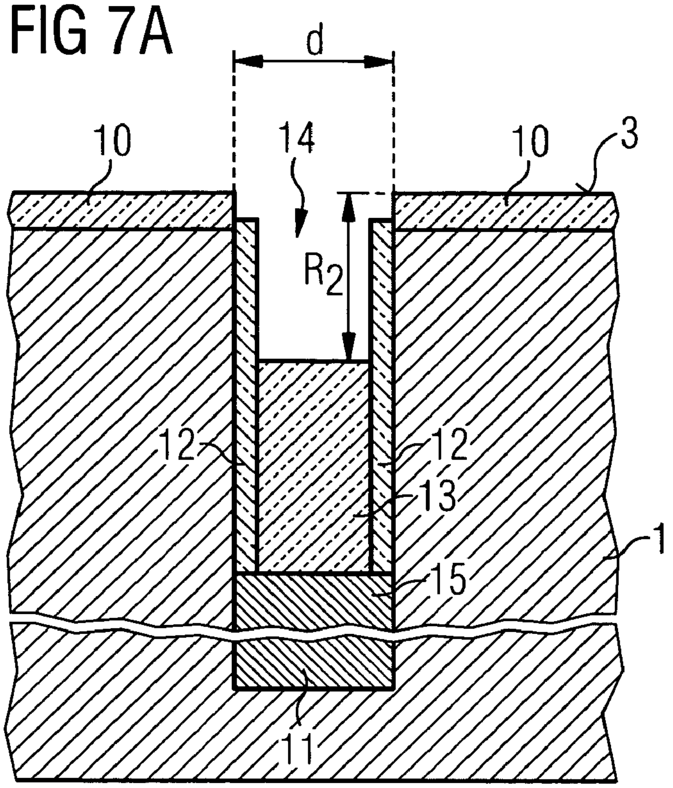
FIGS. 7A to 7C illustrate exemplary surface profiles which can be measured by means of a method according to one embodiment of the invention.
Figure 7B:
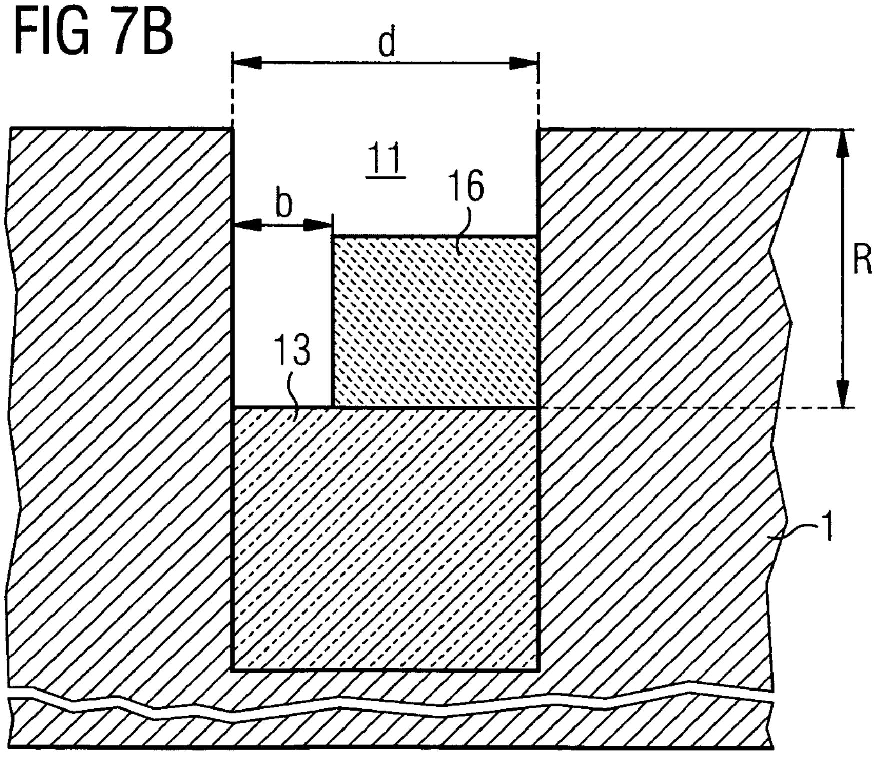
Figure 7C:
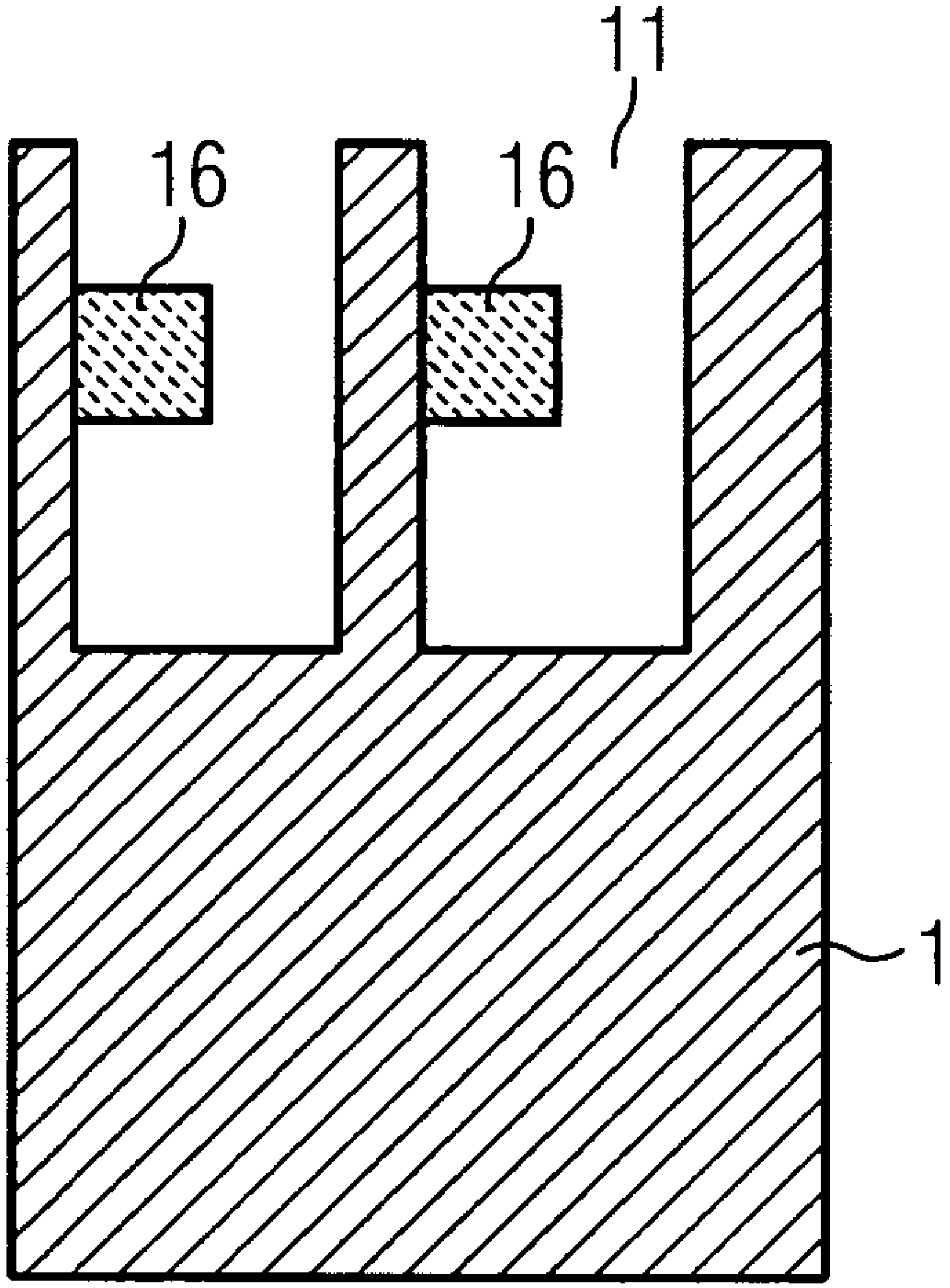

In FIG. 2A, the wafer 1 to be examined contains a multiplicity of etched depressions, for example capacitor trenches 11 such as are illustrated in FIG. 7A. The capacitor trenches 11 have, for example, a depth t of 200 nm, a width d of 90 nm and a distance w of 360 nm. Accordingly, the difference $\Delta z$ between the highest projecting region and the deepest depression is 200 nm. In order to transfer the surface structure of the wafer 1 to be examined, a substrate 5, which is significantly smaller than the wafer in this case, is coated with a transfer layer 4 comprising a composition that is curable by UV light being radiated in. The transfer layer 4 is applied to the substrate 5, which should be transparent to UV radiation in this case, that is to say a quartz substrate for example, by means of generally known methods such as spin-on, for example. The layer thickness corresponds to 4 times the value of $\Delta z$ and is 800 nm.

Figure 2B:
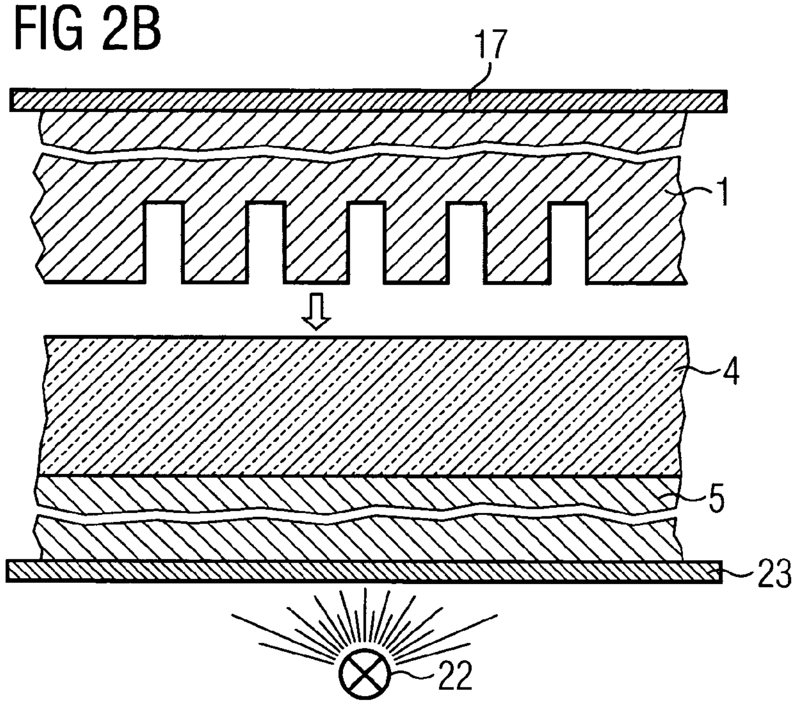

As is illustrated in FIG. 2B, the wafer 1 to be examined is placed onto a sample holder and oriented with respect to the substrate 5, which is situated on a substrate holder 23 transmissive to UV radiation, according to known orientation methods, for example by utilizing pattern recognition.

Depending on the viscosity of the transfer material, it may also be expedient in the case of one embodiment firstly to orient the wafer to be examined and the substrate 5 and then to apply the transfer material to the substrate 5.

The surface 3 of the wafer 1, on which the structures to be measured are situated, is then brought into contact with the transfer layer 5 and a UV lamp 22 situated on the rear side of the substrate is subsequently switched on. The UV lamp 22 is suitable for emitting light having the wavelength by which the transfer layer 4 is cured. As a result, the transfer layer 4 is cured and the surface profile of the wafer 1 is transferred into the transfer layer 4.

Figure 2C:
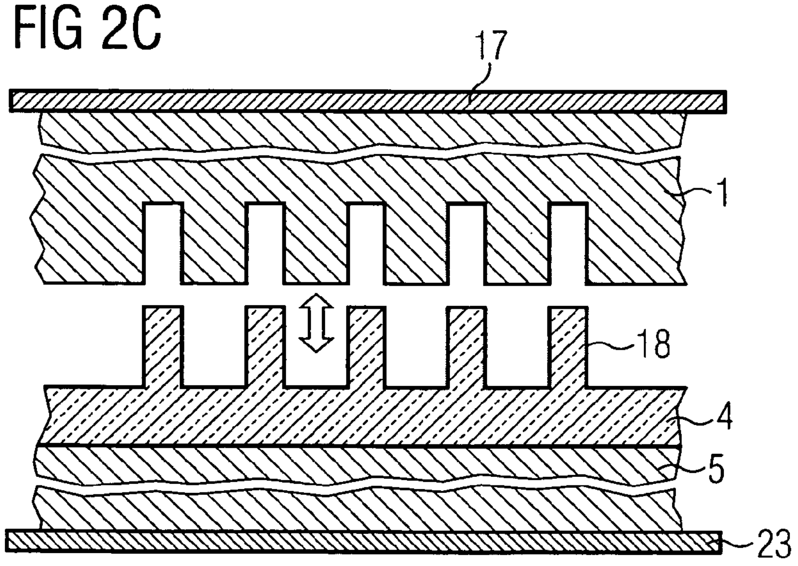

The surface profile illustrated in FIG. 2C results in the transfer layer 4 after the separation of wafer 1 and transfer layer 4. To put it more precisely, pillars instead of depressions are now formed on the transfer layer, and the height of the pillars corresponds to the depth of the depressions contained in the wafer 1. The distance between the pillars corresponds to the distance between the depressions 11. The pillars are now formed in only one material, the transfer material 4, and the aspect ratio of the structures to be measured is only 0.6 given a height of 200 nm and a distance between the pillars of 360 nm. In this case, too, the transfer ratio of surface profile to imprint is 1:1.

It is also possible as an alternative, moreover, to use a transfer material which makes it possible to carry out a transfer with a different transfer ratio, so that the structures contained in the imprint have a smaller size than the surface profile to be measured.

To measure the profiles of the pillars formed and their respective distances, it is possible to use for example a scattering method, in particular a spectroscopic scattering method in reflection. A scattering method of this type involves examining the diffraction of a specific order, that is to say for example 0-th, first or second order, of electromagnetic radiation having a variable wavelength on a periodic arrangement of regions projecting in pillar-like fashion, for example.

Figure 2D:
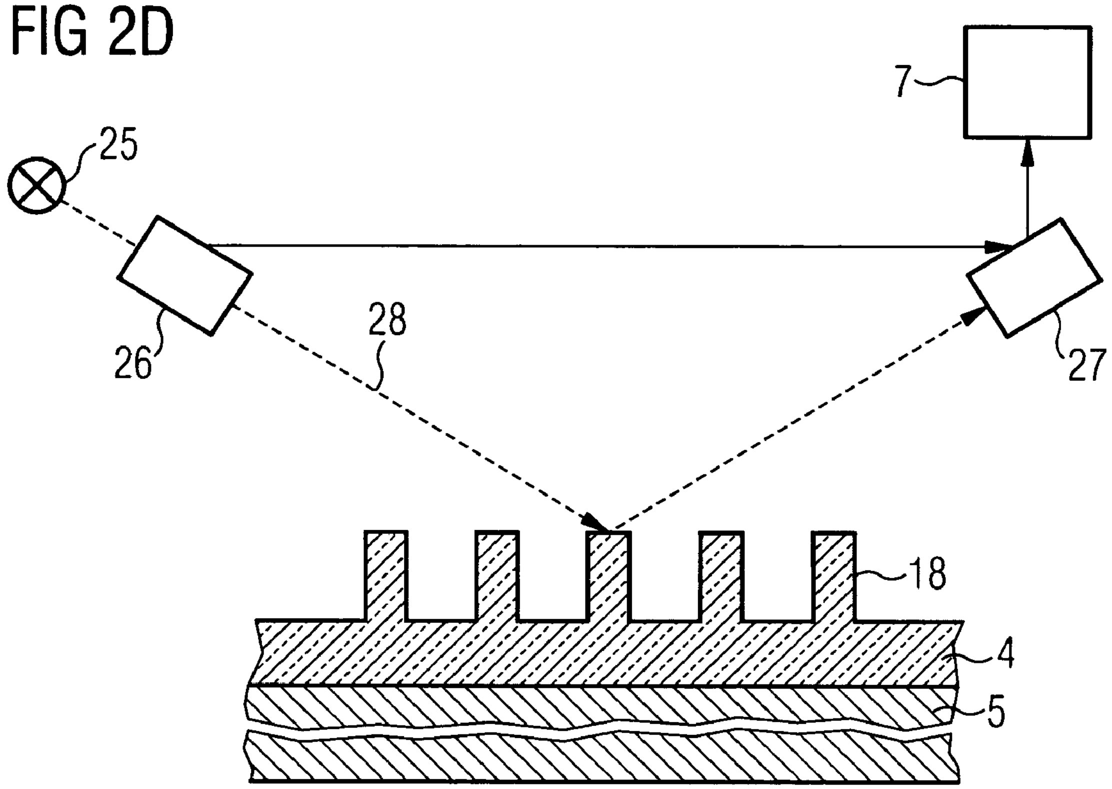

FIG. 2D illustrates an exemplary measurement arrangement. In FIG. 2D, reference symbol 25 designates a light source which is able to emit different wavelengths in a predetermined wavelength range. The emitted light 28 is suitably polarized in the optical device 26 and processed depending on the requirements and is subsequently reflected on the imprint 18. The measuring device 27 is provided in order to analyze the reflected light, that is to say in particular to detect the reflectivity in the corresponding modes, from which diffraction patterns are determined. Light in a wavelength range from UV to visible light is usually used for a scattering method of this type.

The diffraction patterns can be evaluated in various ways. For example, the diffraction patterns may be compared with numerically produced diffraction patterns from a multiplicity of “pattern” arrangements contained in a previously generated library, from which the correct parameters of the arrangement examined are then determined. However, it is also possible to use other evaluation algorithms, in particular real time algorithms. A spatial representation of the examined arrangement comprising regions projecting in pillar-like fashion is produced as a result.

Figure 2E:
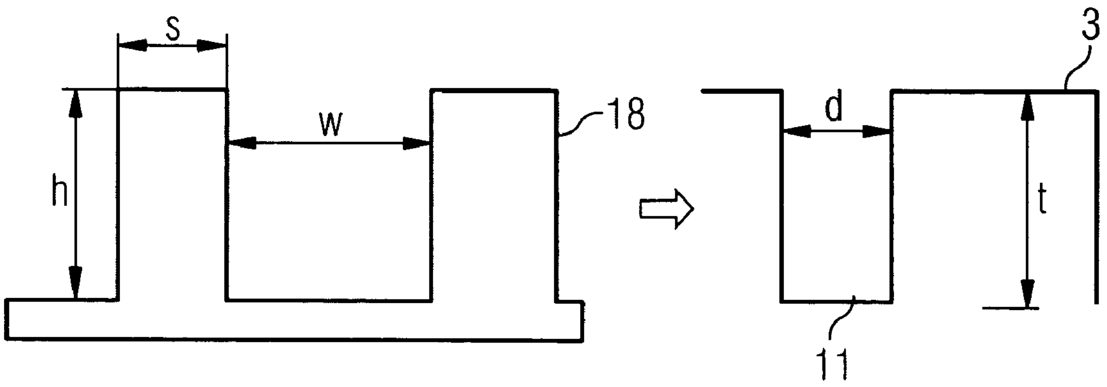

FIG. 2E illustrates, on the left-hand side, an exemplary profile obtained as a result of the reconstruction during the spectroscopic scattering method.

In order to convert the measurement result obtained into the surface profile of the examined sample, in the analysis device 7 the heights h of the measured pillars are converted into depths t of the trenches in the wafer surface 3, and the width s of the measured pillars corresponds to the width d of the trench 11. Consequently, the surface profile illustrated on the right-hand side of FIG. 2E is deduced from the conversion of the measurement results obtained.

The measuring method described in combination with one embodiment of the present invention is advantageous in particular to the effect that only the optical properties of an individual layer, namely the transfer layer 4, have to be taken into consideration in the numerical production of the diffraction patterns. Influences of adjacent materials or layers which are illustrated in FIG. 7A, for example, do not have to be taken into account since the pillars are formed in only a single material.

According to one embodiment of the present invention, however, any possible transfer method may be combined with any measurement method.

Other measurement methods can also be employed, for example spectroscopic ellipsometry using infrared radiation. In the case of this method, it is possible to determine the depth or height of the structures to be measured in the transfer layer by assuming an effective refractive index for the patterned portion of the transfer layer 4, said refractive index representing—in the wavelength range used—an averaging of the refractive index of the transfer layer and that of air. Through selection of a suitable transfer material, when carrying out the method of one embodiment of the present invention, the refractive index of the transfer layer may be selected in such a way that the measurement method yields particularly good results.

The layer thickness of the patterned portion can thus be determined ellipsometrically according to known methods, and the height of the pillars or the depth of the depressions can be determined therefrom.

The measurement setup illustrated in FIG. 2D may also be used, by way of example, for carrying out the spectroscopic ellipsometry, although the measurement results are evaluated differently than in the case of the scattering method described.

Since the substrate coated with the transfer material is no longer needed for the further processing of the wafer, it is also possible, however, to employ destructive test methods, for example scanning electron microscopy after prior coating with metal.

In one case, the results of nondestructive and destructive test methods may be compared with one another in order to increase the measurement accuracy.

Figure 3:
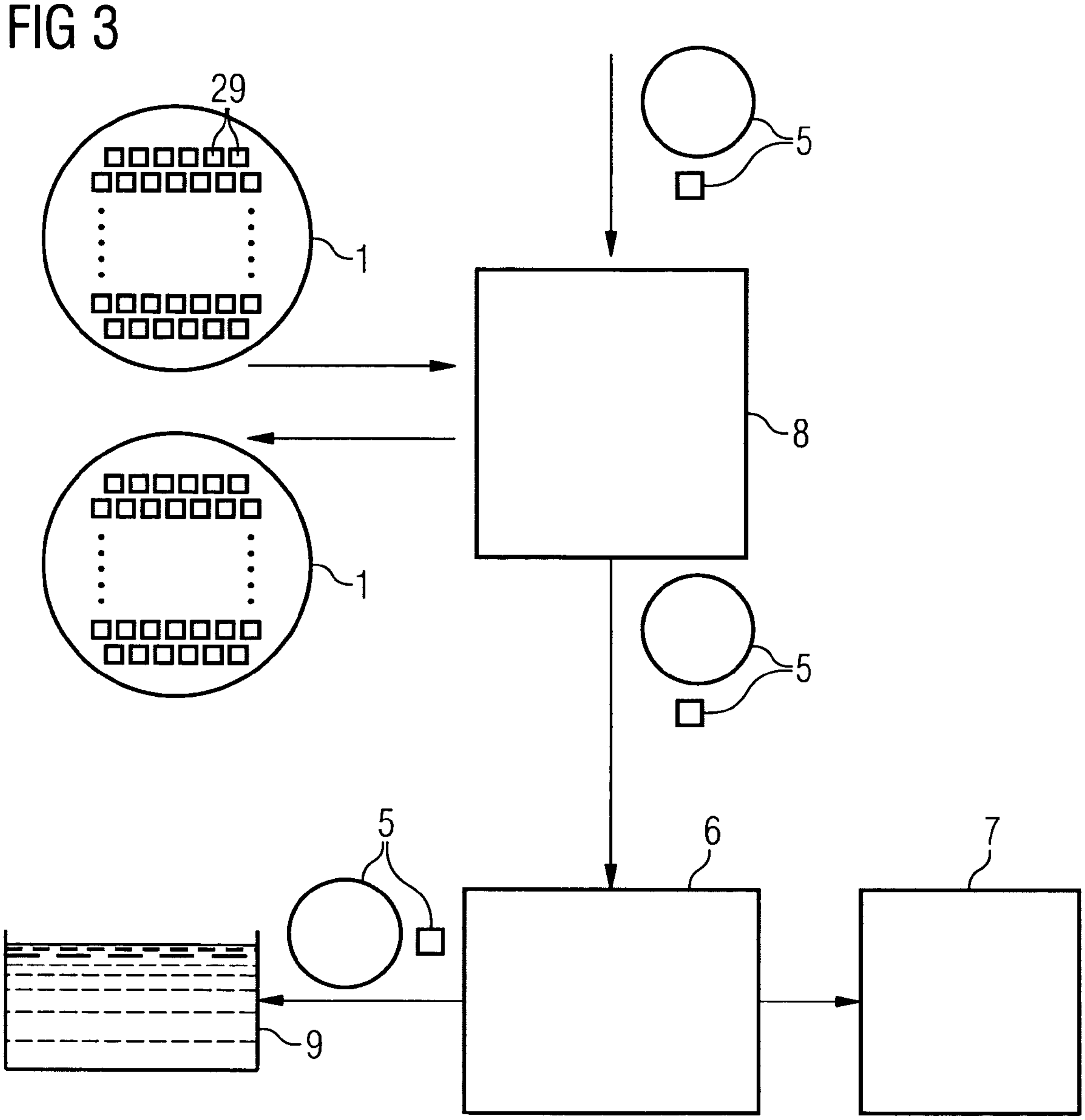
FIG. 3 illustrates a block diagram of an apparatus according to one embodiment of the invention.

FIG. 3 illustrates a block diagram of an apparatus for measuring a surface profile of a sample. This apparatus comprises a transfer device 8, in which an imprint of the surface profile of the sample to be examined is produced on a layer made of a transfer material that is applied on a substrate. The apparatus according to one embodiment of the invention furthermore comprises a device 6 for measuring the imprint and an analysis device 7, which obtains an item of information about the surface profile from the measurement result.

As is illustrated in FIG. 3, the processed semiconductor wafers 1 to be examined are transported in a cassette or in some other transport apparatus suitable for simultaneously transporting a plurality of wafers, into the transfer device 8. Reference symbol 29 respectively designates the patterned zones that become chips after the production method has ended and the wafer has been divided up.

At the same time, the substrates 5 coated with the transfer material 4, which substrates may be wafers, for example, or may be the size of a plurality of chips, are fed to the transfer device 8, likewise in a cassette or a suitable transport apparatus.

In one case, the transfer device 8 contains a robot which can process a plurality of wafers in parallel according to known methods.

In the transfer device 8, according to one of the methods described above, the profile 2 of the surface 3 of the wafer is transferred into the transfer layer 4 of a substrate 5. In this case, it should be taken into account that the transfer device is configured in such a way that the surface profile of a multiplicity of wafers 1 is transferred into a multiplicity of substrates 5 in each case. This is in contrast to the conventional nanoimprint apparatuses, in which the surface profile of a shaped piece that always remains the same is transferred into a plurality of wafers.

In this case, the transfer device 8 may be embodied in such a way that the substrate 5 on which the layer 4 made of a transfer material is applied is a substrate of the same size as the wafer to be examined. In this case, wafer and substrate are oriented with respect to one another according to known orientation or alignment methods.

As an alternative, however, the substrate may also be smaller than the wafer to be examined. For example, the size of the substrate may be selected in such a way that the substrate takes up only a specific chip region, but the substrate size may also be dimensioned in such a way that a plurality of chips are transferred to a substrate. If the substrate is smaller than the wafer to be examined, the transfer device also comprises an orientation device which controls the positioning of substrate and wafer on the basis of pattern recognition, by way of example, so that the desired wafer region is transferred to the substrate.

Afterward, the wafers 1 whose surface profile is to be examined are passed toward the outside again, where they may either be processed further or alternatively be subjected to parallel measurement methods.

The substrates 5 with the imprints produced are then fed to a measuring device 6, where they are measured according to known methods. In this case, it is customary for just one substrate to be measured at a time. The measurement data obtained are fed to the analysis device 7, where conclusions about the measured profile are drawn from the measurement data. In particular, the analysis device 7 is suitable for converting heights into depths and vice versa.

After measurement, the substrates may, if appropriate, be fed to a cleaning bath 9, where the transfer layer 4 is removed, so that the substrates can be reused.

In accordance with a further embodiment of the present invention, the transfer device 8 may be embodied in such a way that the transfer material is firstly applied directly—that is to say without a substrate or other layer carrier—to the surface to be examined, the imprint is produced and then the imprint produced is stripped away from the sample surface and subsequently measured.

Figure 4C:
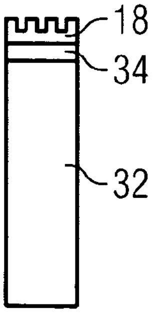

The processes that take place in the transfer device 8 in this embodiment are illustrated in FIG. 4.

Firstly, one or a plurality of intermediate layers (not shown) are optionally applied to the sample surface. Said intermediate layers protect the sample surface and, after the imprint has been produced, enable a good separation of imprint and sample surface. The intermediate layers are very thin in order not to corrupt the measurement result. If an SOG layer (spin-on glass) is used as the transfer material 4, then pyrolytic carbon, for example, which is deposited from the gas phase and arises for example during the combustion of hydrocarbons in a low-oxygen atmosphere, may be used as a protective layer. An adsorbate of a fluorocarbon compound may additionally be used as a separating layer.

As is illustrated in FIG. 4A, a suitable transfer material 4 is subsequently applied to the sample surface to be examined, by means of a suitable application method.

Suitable transfer materials are in particular spin-on glass and further materials that shrink during curing.

In the present case, a spin-on glass layer is produced locally on the sample surface. In this case, a customary layer thickness again corresponds to at least 1.5 times the maximum height difference within the surface profile. Given a suitable viscosity of the starting substance, the spin-on glass layer can be produced locally by being dripped on at the predetermined location.

As an alternative, it could also be applied over the whole area by means of spinning-on, by way of example.

Reference symbol 33 designates a sample holder, which may be rotatable, by way of example. The starting substance for a spin-on glass is silicon tetraacetate dissolved in a solvent, which is applied to the sample surface. If the layer is heated at a suitable temperature, then an $SiO_2$-like layer arises as a result of crosslinking, said layer having shrunk with respect to the original layer. The organic resist layer is accordingly converted into an inorganic layer as a result of the heating.

The transfer material is subsequently cured. Depending on the transfer material, this may be effected for example by heating or baking at temperatures that are customary for this. As an alternative, this may also be effected by means of a suitable irradiation method, for example irradiation with light or ions.

In the present case, the spin-on glass layer is cured at 800° C. for thirty minutes, as a result of which it shrinks by 30%.

The imprint is subsequently stripped away from the sample surface to be measured. In this case, the stripping process may be effected in such a way that the imprint is stripped away over the whole area with the size of the overall sample. A local stripping process is illustrated here.

As illustrated in FIG. 4B, the spin-on glass layer 4 is only applied locally on the wafer surface. The imprint is stripped away locally with the aid of a special pin 32, the position of which can be controlled precisely. For this purpose, firstly a thin precursor layer, for example made of tungsten carbonyl or tetramethylsiloxane, is applied on the pin 32. The pin is then brought into contact with the spin-on glass layer at a predetermined position and an ion or electron beam 35 is simultaneously directed onto the precursor layer, so that the precursor is decomposed. The tungsten or silicon dioxide liberated in this case then serves as adhesive 34 and enables a connection between the pin and the imprint 18 produced in the spin-on glass layer.

As an alternative, however, it is also possible for the pin 32 to be pressed into the surface at the predetermined location during the curing of the spin-on glass layer 4 and to be withdrawn after the end of the curing process. In this case, the spin-on glass material adheres to the pin by virtue of adhesion forces. As a further possibility, a roughened plate may also be pressed into the surface of the spin-on glass layer during the curing process.

The imprint is subsequently examined according to known methods as described above.

After the incineration of the separating layers and an optional cleaning step, the sample wafer examined can be processed further.

Figure 5A:
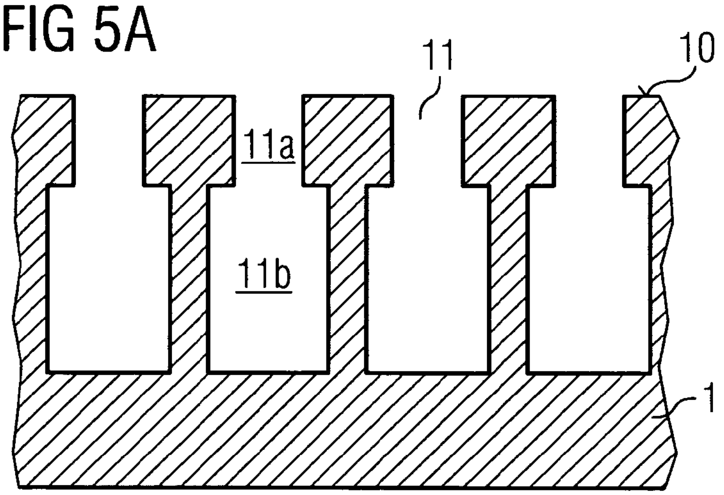
FIGS. 5A to 5C are illustrations of an alternative embodiment of the present invention.
Figure 5B:
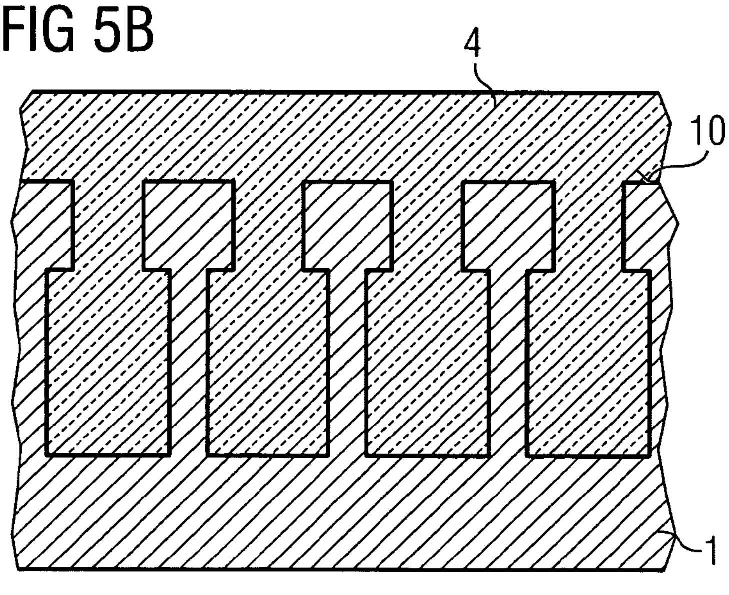
Figure 5C:
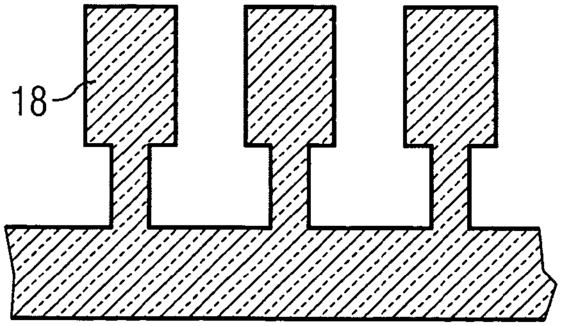

FIGS. 5A to 5C illustrate by way of example the steps for producing an imprint using a shrinking transfer material.

In FIG. 5A, reference symbol 1 designates a part of a semiconductor wafer with an $Si_3N_4$ layer 10 applied thereto and also trenches 11 etched into the surface, which have a larger diameter in their lower region than in their upper region.

FIG. 5B illustrates the sample surface with a spin-on glass layer 4 applied thereto. FIG. 5C illustrates the imprint after curing for 30 minutes at 800° C. The imprint 18 is fixed for example on a stripping apparatus (not shown). As can be seen, the size of the imprint is significantly reduced compared with the original size of the surface profile. Furthermore, the imprint has shrunk to a significantly lesser extent in the upper trench region 11*a* than in the lower trench regions 11*b* since a high degree of shrinkage would not be possible at all on account of the geometrical structure of the trench in the upper trench region.

The imprint 18 obtained can then be measured according to known methods. In particular, the imprint may be coated with a suitable metal and be analyzed with the aid of a scanning electron microscope (SEM), or else an optical examination method, in particular a scattering method as described above, may be employed.

Figure 6A:
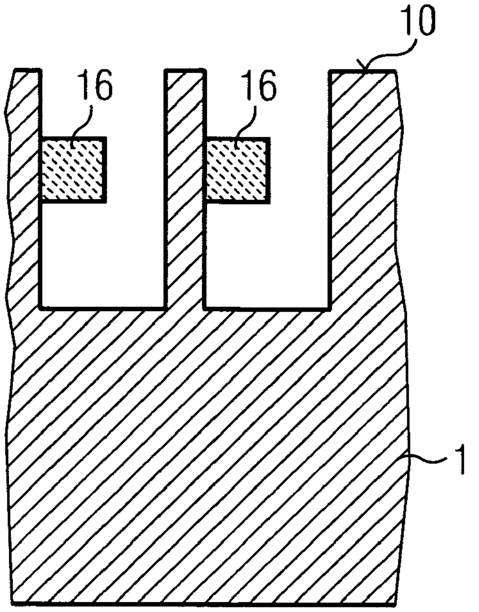
FIGS. 6A to 6C are illustrations of an alternative embodiment of the present invention.
Figure 6B:
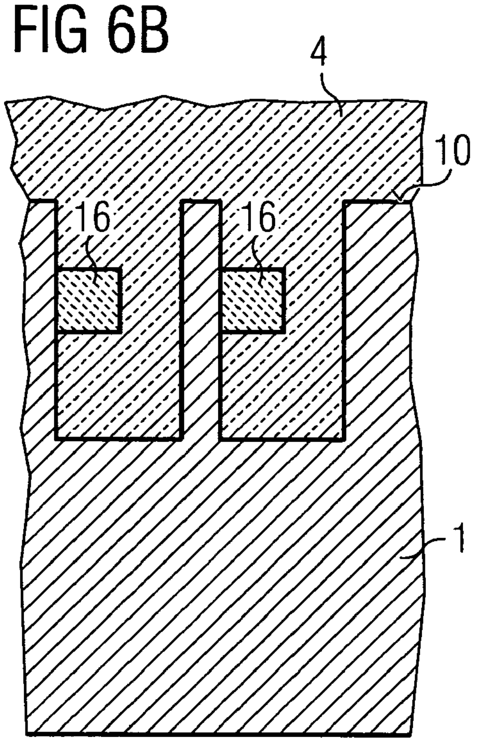
Figure 6C:
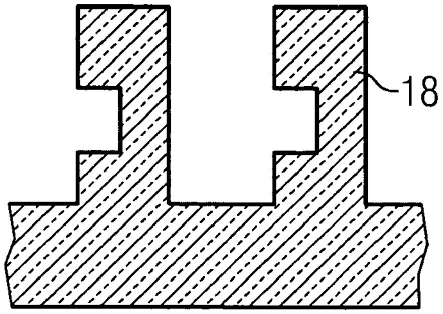

FIGS. 6A to 6C illustrate by way of example the steps for producing an imprint using a shrinking transfer material in the case of a further exemplary surface profile.

In FIG. 6A, reference symbol 1 designates a semiconductor substrate 1 with an $Si_3N_4$ layer 10 applied thereto. Trenches 11 are etched into the semiconductor surface, a one-sided structure 16, for example made of $SiO_2$, in each case being arranged in the upper part of said trenches. As is illustrated in FIG. 6B, a spin-on glass layer 4 is formed on the sample surface. The imprint 18 illustrated in FIG. 6C results after curing and stripping away of the spin-on glass layer, which imprint is usually applied on a suitable carrier (not shown) and can subsequently be measured according to known methods.

As can be seen from FIG. 6C, even structures in a sidewall of the trench can be transferred and measured by means of the method according to one embodiment of the invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating an integrated circuit comprising:

bringing at least a portion of a sample surface of a patterned semiconductor wafer comprising a surface profile into contact with a transfer material that is deformable and curable under suitable ambient conditions such that an imprint of the portion is transferred into the transfer material;

separating the sample surface and the transfer material wherein the imprint is uncovered;

measuring dimensions of the uncovered imprint; and evaluating, from the dimensions of the uncovered imprint, dimensions of the surface profile of the semiconductor wafer.

2. The method of claim 1, wherein the layer thickness of the transfer material corresponds to at least 1.5 times a maximum height difference $\Delta z$ within the surface profile, the maximum height difference $\Delta z$ corresponding to the distance between a highest projecting region and a deepest depression, said distance being determined perpendicularly to the sample surface.

3. The method of claim 1, wherein the transfer material comprises a thermoplastic polymer.

4. The method of claim 3, wherein the thermoplastic polymer is selected from the group comprising polymethyl methacrylate, polycarbonate, polyester and novolak-resin-based polymers.

5. The method of claim 1, further comprising:

heating the transfer material to a temperature at which the transfer material becomes soft, prior to bringing the sample surface into contact with the transfer material; and cooling the transfer material to a temperature at which the transfer material becomes hard, after bringing the sample surface into contact with the transfer material.

6. The method of claim 1, wherein the transfer material is deformable during the process of bringing it into contact with the sample surface and is curable under the action of heat.

7. The method of claim 6, further comprising heating the transfer material to a temperature at which the transfer material cures, after bringing the sample surface into contact with the transfer material.

8. The method of claim 1, wherein the transfer material comprises a material which is deformable during the process of bringing it into contact with the sample surface and is curable under the action of photon radiation.

9. The method of claim 8, wherein the transfer material comprises a material which is curable under the action of UV radiation.

10. The method of claim 8, further comprising irradiating the transfer material with photons during the step of bringing the sample surface into contact with the transfer material so that the transfer material cures.

11. The method of claim 1, further comprising:

providing a substrate; and applying the layer made of the transfer material on the substrate, which are carried out before the step for bringing the sample surface into contact with the transfer material, wherein while bringing the sample surface into contact with the transfer material, the transfer material applied on the substrate is brought into contact with the sample surface.

12. The method of claim 11, further comprising inserting a pressure on the semiconductor wafer and the substrate during the bringing-into-contact step.

13. The method of claim 11, wherein the substrate is a silicon wafer.

14. The method of claim 11, wherein the semiconductor wafer has the same size as the substrate.

15. The method of claim 11, wherein the semiconductor wafer is larger than the substrate.

16. The method of claim 11, further comprising removing the transfer material from the substrate after the measuring the imprint, so that the substrate can be used for a further method.

17. The method of claim 1, wherein the semiconductor wafer is a patterned silicon wafer.

18. The method of claim 1, wherein the step for measuring the imprint is effected by means of one of the group comprising a scanning probe method, a scattering method, an ellipsometric method, scanning electron microscopy, and microscopy using focused ion beams.

19. The method of claim 1, wherein the transfer material is configured in such a way that a horizontal and a vertical dimension within the surface profile are transferred with the same size into the imprint.

20. The method of claim 1, wherein the transfer material is configured in such a way that a horizontal and a vertical dimension in the imprint is smaller than within the surface profile.

21. The method of claim 7, wherein the transfer material is shrunk during curing.

* * * * *